United States Patent [19]
Stauffer
[11] 4,176,625
[45] Dec. 4, 1979

[54] PULSE TIME ADDITION CIRCUIT FOR ELECTRONIC FUEL INJECTION SYSTEMS

[75] Inventor: Reuben L. Stauffer, Newport News, Va.

[73] Assignee: The Bendix Corporation, Southfield, Mich.

[21] Appl. No.: 789,382

[22] Filed: Apr. 20, 1977

[51] Int. Cl.[2] .......... F02B 3/10; H03K 1/18

[52] U.S. Cl. .......... 123/32 EH; 123/32 EA; 364/431; 307/267

[58] Field of Search .......... 123/32 EH, 32 EA; 307/265, 267, 294, 353; 364/431, 605, 701, 733, 829; 320/1

[56] References Cited

U.S. PATENT DOCUMENTS

| | | | |
|---|---|---|---|
| 3,593,692 | 7/1971 | Scholl et al. | 123/32 EH |
| 3,661,126 | 5/1972 | Baxendale | 123/32 EA |

FOREIGN PATENT DOCUMENTS

| | | | |
|---|---|---|---|
| 965508 | 4/1975 | Canada | 123/32 EH |
| 45-29623 | 9/1970 | Japan | 364/829 |
| 377801 | 8/1973 | U.S.S.R. | 364/829 |

*Primary Examiner*—Charles J. Myhre
*Assistant Examiner*—P. S. Lall
*Attorney, Agent, or Firm*—William A. Marvin; Russel C. Wells

[57] ABSTRACT

An electronic fuel injection system wherein fuel injectors are turned on by electrical pulses whose time periods are controlled in accordance with information received from various engine condition sensors. A primary pulse is transmitted for each revolution of the engine and this pulse is used to turn on the fuel injectors for the controlled time period. Auxiliary pulses for acceleration enrichment are also used to turn on the same fuel injectors for a time period that is controlled by throttle conditions. A pulse time addition circuit is provided so that the time period of an acceleration enrichment pulse is added to the time period of a primary pulse even when the acceleration enrichment pulse occurs during the period of the primary pulse thereby insuring that the desired total amount of fuel is added to the engine regardless of the sequence of occurrence of the control pulses.

19 Claims, 4 Drawing Figures

PULSE TIME ADDITION CIRCUIT FOR ELECTRONIC FUEL INJECTION SYSTEMS

BACKGROUND OF THE INVENTION

This invention relates to pulse time addition circuitry and more particularly to an improved pulse time addition circuit for use in an electronic fuel injection system for insuring that the desired total amount of fuel is added to the engine regardless of the sequence of generation of control pulses.

Many types of electronic fuel injections systems are known in the prior art, such as those shown in U.S. Pat. Nos. 3,548,792; 3,643,635; 3,689,755; 3,750,632; and 3,986,006. Prior art electronic fuel injection systems employ fuel injectors for feeding fuel to an engine. The fuel injectors are turned on and off by electrical pulses whose time period or pulse duration is controlled in accordance with information received from various engine sensors.

Many systems employ a primary pulse which is triggered for each revolution of the engine and this pulse is used to turn on a group of fuel injectors for a controlled time period. Auxiliary pulses for acceleration enrichment are used to turn on the same injectors for time periods that are also controlled. The acceleration enrichment pulses are initiated by a device on the throttle body and are not synchronous with the primary pulses.

In conventional circuits, an acceleration enrichment pulse that occurs during the time period of a primary pulse will not add anything to the total fuel received by the engine and therefore, the total amount of fuel supplied to the engine is less than the combination of the time periods of the primary pulses and auxiliary acceleration enrichment pulses would dictate.

The prior art also teaches a method of generating the primary fuel control pulse in an electronic fuel injection system. A voltage V(map) which varies with the intake manifold absolute pressure (m.a.p.) is connected to the non-inverting terminal of a voltage comparator. A capacitor, which is charged by a charging current, is connected to the inverting input terminal of the voltage comparator. The capacitor is quickly discharged each time a trigger is received from the engine revolution sensor. The primary fuel control pulse $T_p$ is initiated at the time of an engine revolution trigger and is terminated when the voltage on the capacitor reaches the value of V(map).

A non-synchronous acceleration enrichment pulse $T_{AE}$ is added by means of a logical "OR" gate to provide a logical sum, one input of the gate being connected to the output of the comparator and the other input being connected to the source $T_{AE}$ pulses. The logical OR gate therefore provides an accurate additive output only so long as no portion of the $T_{AE}$ pulse occurs during the time period of the primary pulse $T_p$.

The present invention provides a relatively simple, inexpensive, highly reliable circuit for providing the required additive pulse output regardless of whether the acceleration enrichment pulse $T_{AE}$ occurs within or without the time period of the primary pulse $T_p$.

SUMMARY OF THE INVENTION

The present invention provides a pulse time addition circuit which employs a charging capacitor and means for periodically discharging the capacitor upon each revolution of the engine. Means are provided for normally supplying current to the capacitor for charging it, and a means is provided for generating an acceleration enrichment pulse $T_{AE}$ having a first time duration.

Means are also provided for generating a primary pulse $T_p$ normally having a second time duration whenever the first acceleration enrichment pulse $T_{AE}$ does not exist simultaneously therewith, but having an increased time duration equal to a first time duration plus the second time duration whenever the acceleration enrichment pulse does occur during the time period of the primary pulse $T_p$.

Means responsive to the existence of the acceleration enrichment pulse $T_{AE}$ is provided for interrupting the supply of current to the capacitor to delay its further charging for a time period equal to the duration of the acceleration enrichment pulse thereby increasing the duration of the primary pulse $T_p$ by this additional time period. Logical gating means are provided having one input coupled to the means for generating the acceleration enrichment pulses $T_{AE}$ and the other input coupled to the means for generating the primary pulses $T_p$ for outputting a pulse combination $T_p+T_{AE}$ having a total pulse duration or time period equal to the time duration of the two separate pulses whenever both of the pulses occur within a predetermined period regardless of whether or not the primary pulse $T_p$ and acceleration enrichment pulse $T_{AE}$ exist simultaneously.

In the preferred embodiment of the present invention, a pulse time addition circuit includes a switching means responsive to the existence of an acceleration enrichment pulse for preventing current from charging the capacitor for the time period of the acceleration enrichment pulse. Therefore, if the acceleration enrichment pulse occurs during the period of the primary pulse, the delayed charging of the capacitor will increase the time period of the primary pulse by amount equal to the time period of the acceleration enrichment pulse and if it occurs at any other time, it will be combined via a logical OR gate to increase the overall combined time period of the pulse combination thereby insuring that the engine receives the total amount of fuel dictated by the combined time periods of the various control pulses.

In an alternate embodiment of the present invention, means are provided for selectedly varying the charging current to slow the charging rate of the capacitor, stop charging altogether, or even to selectively discharge the capacitor to allow even greater control over the width of the primary pulse.

The pulse time addition circuit of the present invention insures that the proper amount of fuel is injected into the engine and prevents losses which have previously occurred whenever the acceleration enrichment pulse occurred during the period of the primary pulse.

These and other objects and advantages of the present invention will be more fully understood from the following detailed description of the drawings and the preferred embodiment, the appended claims and the drawings which are briefly described hereinbelow.

DESCRIPTION OF THE PREFERRED EMBODIMENT

Figure 1:
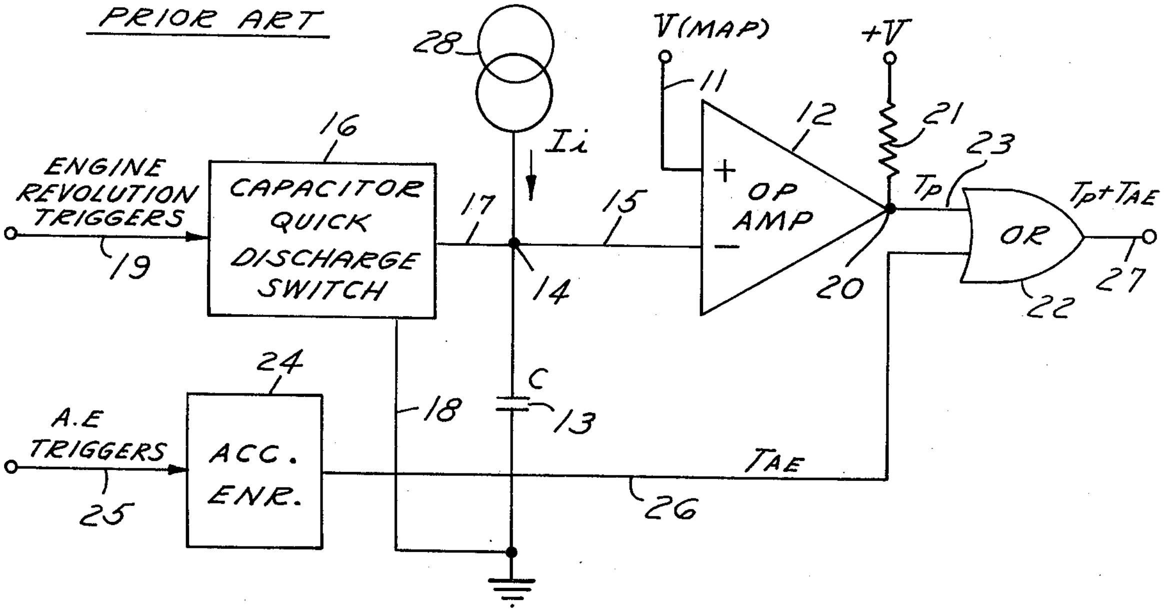
FIG. 1 PRIOR ART
FIG. 1 is a block diagram schematic of a prior art pulse time addition circuit used in electronic fuel ignition systems.

FIG. 1 shows a prior art pulse time addition circuit used in a conventional electronic fuel injection system. A voltage V(map) which varies with the intake manifold absolute pressure of the engine is connected via lead II to the non-inverting input terminal of the voltage comparator such as a conventional operational amplifier 12. A capacitor 13 which is charged by a current $I_i$ has one plate connected to the inverting input terminal of the voltage comparator 12 via node 14 and lead 15.

The capacitor 13 is quickly discharged, as by a discharge switch 16 each time a engine revolution trigger spike is received from a conventional engine revolution sensor, not shown, but conventionally known. The discharge switch 16 is coupled between one plate of the capacitor 13 via node 14 and lead 17 and thence to ground via lead 18. The input trigger of the discharge switch 16 is taken from lead 19 and supplies the engine revolution trigger spikes to the discharge switch 16 to momentarily complete a conductive path between one plate of the capacitor 13 and ground via node 14, lead 17 and lead 18. This rapidly discharges capacitor 13 and then opens the path between leads 17 and 18 to allow capacitor 13 to be charged via the charging current $I_i$.

The output of the comparator 12 is taken from comparator output node 20 which is connected via resistor 21 to a source of potential +V. The output node 20 supplies a primary pulse $T_p$ to a first input of a logical OR gate 22 via lead 23. The output 20 of the comparator 12 goes high to indicate the generation of the primary pulse $T_p$ as soon as the capacitor 13 has been discharged by the switch 16 and begins to be charged by the current $I_i$. The signal present at the output 20 will remain high until the voltage level at node 14, which represents the voltage at the plate of the capacitor 13, becomes equal to or attains some other predetermined relation to the voltage V(map) which is present at the non-inverting input of the comparator 12. At this time, the signal at the output 20 goes low terminating the generation of the primary pulse $T_p$.

A conventional acceleration enrichment pulse generating circuit 24 receives acceleration enrichment trigger spikes via lead 25 from a sensing device associated with the throttle or the like and outputs acceleration enrichment pulses $T_{AE}$ having a controlled time duration via lead 26. The acceleration enrichment pulses $T_{AE}$ are supplied via lead 26 to the second input of the logical OR gate 22 so that the output 27 of the logical OR gate 22 provides for a logical addition of the pulses $T_p$ and $T_{AE}$. Therefore, the prior art circuit of FIG. 1 will output a combination of electrical pulses sufficient to allow the proper amount of fuel to be injected into the engine so long as the acceleration enrichment pulse is not generated during the time period of the primary pulse. However, when an acceleration enrichment pulse $T_{AE}$ does occur during the time period of the primary pulse $T_p$, the output pulse combination will not add any thing to the fuel received by the engine in accordance with the time period of the primary pulse $T_p$.

Figure 4:
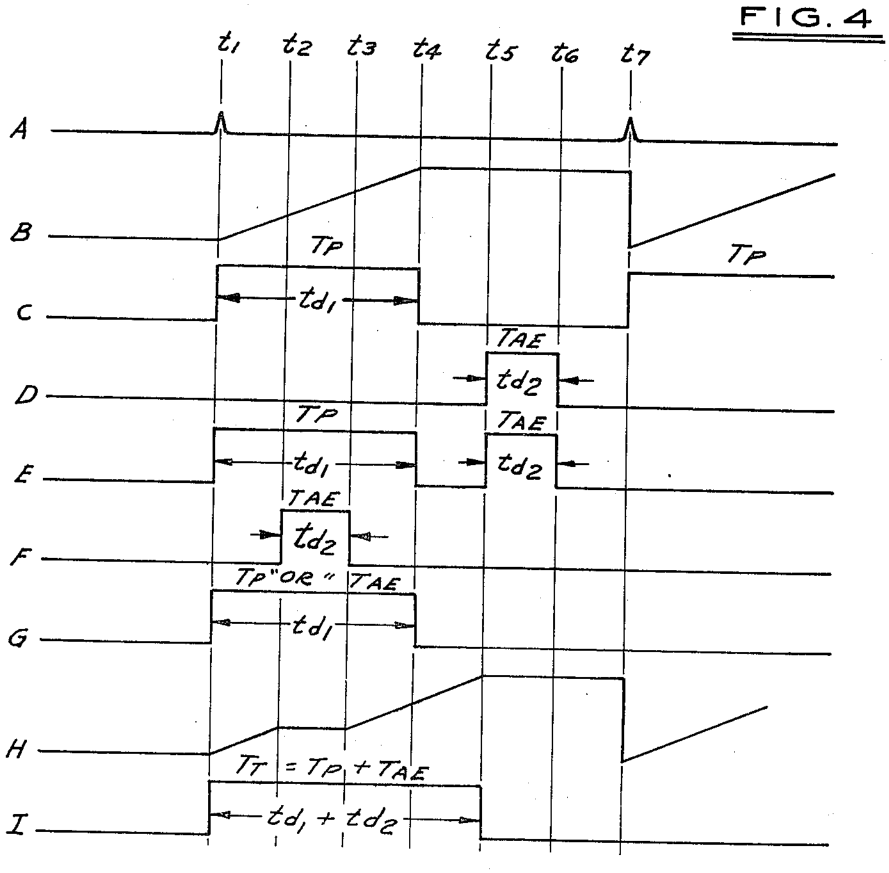
FIG. 4 is an electrical timing diagram for illustrating the advantages of the circuit of FIG. 2 over the prior art circuit of FIG. 1.

The problem will be more fully understood with reference to the timing diagram of FIG. 4. FIG. 4 shows a plot of voltage versus time and FIG. 4A shows the time of occurrence of the engine revolution trigger pulses or spikes which are supplied via lead 19 to the input of the discharge switch 16 and which occur, in FIG. 4A, at times $t_1$ and $t_7$. As soon as the capacitor 13 has been discharged by the momentary closure of the switch 16, the current $I_i$ from a current source 28 will be supplied to the capacitor 13 via node 14 to begin recharging the capacitor 13. The voltage builds on the capacitor 13 as shown in FIG. 4B. The voltage ramp begins to build at time $t_1$ and increases until a time $t_4$ when the voltage on the capacitor 13 is equal to or attains some other predetermined relationship with the voltage V(map) which is present at the non-inverting input of comparator 12. From this point on, the voltage on the capacitor 13 will remain the same or increase until, at time $t_7$, the next engine revolution trigger pulse to arrive will again trigger the discharge switch 16 to discharge the capacitor 13 to begin the cycle anew.

The output of the comparator 12 is shown in FIG. 4C. The output 20 goes high at time $t_1$ when the capacitor 13 begins to charge and stays high until the time $t_4$ when the output goes low. The pulse shown in FIG. 4C is the normal primary pulse $T_p$ and has a time period or pulse duration $t_{d1}$.

The acceleration enrichment pulse $T_{AE}$ which is generated by the circuitry of block 24 and supplied via lead 26 to the second input of the OR gate 22 is shown in FIG. 4D as being generated at a time $t_5$ and terminating at a time $t_6$. The pulse $T_{AE}$ has a time period or pulse duration $t_{d2}$.

Since the acceleration enrichment pulse $T_{AE}$ was generated outside of the time period of the primary pulse $T_p$, the output of the logical OR gate 22 is $T_p+T_{AE}$ and is shown in FIG. 4E. The total combined time period which the fuel injectors will remain on is therefore $t_{d1}+t_{d2}$ and this insures that the proper amount of fuel is supplied to the engine.

FIG. 4F represents the circumstance in which the acceleration enrichment pulse $T_{AE}$ occurs within the time period of the primary pulse $T_P$. The acceleration enrichment pulse of FIG. 4F is initiated at a time $t_2$ and terminates at a time $t_3$. For simplicity sake, the acceleration enrichment pulse $T_{AE}$ in FIG. 4F has a time period or pulse duration $t_d$ equal to the time $t_3$—$T_2$. FIG. 4G represents the output of the logical OR gate 22 of the circuit of FIG. 1. It will be observed that the total combined time duration of the OR'ed output of gate 22 is equal to $T_{d1}$ or $t_x$—$t_1$, hence a time period equal to the duration $t_d$ of the acceleration enrichment pulse $T_{AE}$ has been lost since it occurred within the time period of the primary pulse $T_p$. Therefore, insufficient fuel is injected into the engine greatly reducing the efficiency and reliability of the electronic fuel injection systems of the prior art.

Figure 2:
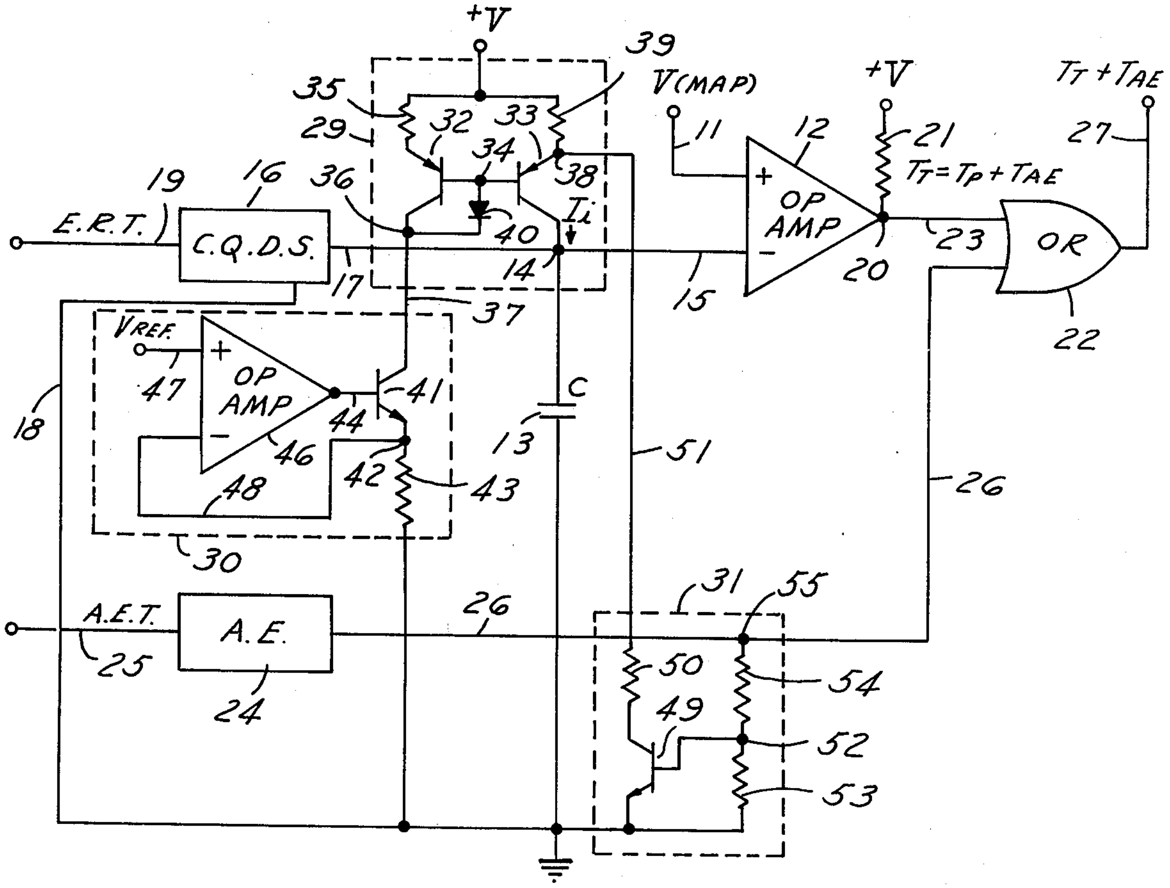
FIG. 2 is a schematic diagram of the preferred embodiment of the pulse time addition circuit of the present invention.

FIG. 2 illustrates the preferred embodiment of the improved pulse time addition circuit of the present invention. In FIG. 2, similar elements are designated with corresponding reference numbers. In the circuit of FIG. 2, the current source 28 has been shown in schematic detail within dotted blocks 29 and 30. The circuit within block 29 includes a current mirror circuit having a first or primary leg and a second or reflective leg. Additionally, a transconductance circuit within block 30 is connected to the first or primary leg of the current mirror circuit in block 29. A switching circuit 31 has been added to the reflective leg for control purposes; this latter circuit 31 having been added to the block diagram of FIG. 1.

The current mirror circuit 29 includes PNP transistors 32 and 33 having their base electrodes commonly coupled via node 34. The emitter of the first transistor 32 is connected via a resistor 35 to a source of potential +V and its collector electrode is connected via collector node 36 to a lead 37. The series combination of resistor 35, transistor 32, node 36 and lead 37 comprises the first or primary leg of the current mirror 29.

The second PNP transistor 33 has its emitter electrode connected directly to a node 38. Node 38 is connected through a resistor 39 to the source of potential +V and the collector electrode is connected directly to node 14 so that the second or reflective leg of the current mirror 29 includes resistor 39, node 38, transistor 33 and node 14 which is coupled directly to the first plate of the capacitor 13. A diode 40 has its anode connected to the common node 34 and its cathode connected directly to the node 36 to establish a 0.6 volt differential or standoff between the base and collector of transistor 32.

In operation, the transconductance circuit 30 controls the amount of control current or primary current flowing in the first or primary leg of the current mirror 29. Since this current is flowing through transistor 32, a correspondingly similar current or reflected current $I_i$ is flowing in transistor 33. The current $I_i$ is therefore controlled by the transconductance device 30 and it is this current which charges the capacitor 13 as previously described.

The transconductance circuit 30 includes a transconductance transistor 41 having its collector directly connected to lead 37 and its emitter directly connected to an emitter node 42. The emitter node 42 is connected to ground through a resistor 43. The base of the transistor 41 is connected via lead 44 to the output of an operational amplifier 46 whose non-inverting input is connected via lead 47 to a source of reference potential selected to provide the required charging current $I_i$ in the reflective leg of the current mirror 29. The inverting input of the amplifier 46 is connected via lead 48 to node 42 so that the operational amplifier 46 is able to control the primary current flowing through the transconductance transistor 41 and therefore the current flowing through the primary leg of the current mirror 29 thereby controlling the charging current $I_i$.

Lastly, the switching circuit 31 includes a switching transistor 49 having its collector connected through the series combination of a resistor 50 and a lead 51 to emitter input node 38 of mirror transistor 33 and its emitter connected directly to the ground. The base of transistor 49 is connected to a node 52 which is connected through a resistor 53 to ground and through a resistor 54 to a switch input node 55. The switch input node 55 is located on the lead 26 which connects the output of the acceleration enrichment pulse generating circuit 24 to the second input of the OR gate 22.

In operation, the circuit of FIG. 2 will operate as did the circuit of FIG. 1 for the case wherein the acceleration enrichment pulse $T_{AE}$ is generated other than within the time period of the primary pulse $T_p$. Under these conditions, the primary pulse $T_p$ and the acceleration enrichment pulse $T_{AE}$ are logically summed by OR gate 22 as shown in FIG. 4E to insure that the proper amount of fuel is injected into the engine.

However, the circuit of FIG. 2 has the additional advantage of insuring that the proper amount of fuel is injected into the engine even when the acceleration enrichment pulse $T_{AE}$ is generated within the time period of the primary pulse $T_p$ as illustrated by the situation depicted in FIGS. 4E and 4F. The switching circuit 31 has the switching transistor 49 normally biased into a non-conducting state so that the circuit has no effect on the flow of the charging current $I_i$ in the reflective leg of the current mirror 29. However, the switching circuit 31 responds to the presence of an acceleration enrichment pulse $T_{AE}$ by switching transistor 29 to the conductive state and providing a by-pass for the charging current normally passing through resistor 39. Therefore, the charging current $I_i$ will immediately cease to flow through the node 14 to the capacitor 13 and the charging of the capacitor 13 will be suspended or delayed so long as transistor 49 remains in a conductive state.

As soon as the $T_{AE}$ pulse goes low, transistor 49 will be switched off thereby again allowing the current $I_i$ to flow in the reflective branch of the current mirror 29 to again resume the charging of the capacitor 13. If this occurs outside the time period of the primary pulse $T_p$, it can have no effect upon the time duration of the primary pulse $T_p$ and the output of OR gate 22 will be uneffected to provide the proper output as illustrated in FIG. 4E.

If, however, the acceleration enrichment pulse $T_{AE}$ occurs within the time period of the primary pulse $T_p$, as indicated in FIGS. 4E and 4F, the time period or duration of the pulse $T_p$ will be extended as hereinafter described. FIG. 4H shows the voltage on the capacitor 13 and FIG. 4I represents the output of the comparator 12. It will be observed that as soon as the engine revolution trigger arrives and discharges the capacitor 13, the current $I_i$ begins recharging the capacitor and the output pulse $T_T$, shown in FIG. 4I, goes high at time $t_1$. At time $t_2$, the $T_{AE}$ pulse is generated causing transistor 49 to interrupt the charging of the capacitor 13. This is indicated by the level portion of FIG. 4H occurring between times $t_2$ and $t_3$. At time $t_3$ the acceleration enrichment pulse $T_{AE}$ again goes low and allows the capacitor 13 to begin charging again.

At time $t_5$, the voltage on the capacitor 13 reaches the predetermined value determined by $V_{(map)}$ causing the output 20 of the comparator 12 to again go low. The stretched pulse $T_t$ will then be inputted to OR gate 22 and passed to its output. It will be noted, however, that the time period or pulse duration of the pulse $T_T$ has been extended by the pulse duration or time period of the acceleration enrichment pulse $T_{AE}$ since its generation was delayed during that time period. Therefore, the time period of the pulse $T_T$ is equal to $T_{d1}+T_{d2}$ or the combined pulse widths of the pulses $T_p$ and $T_{AE}$ thereby insuring that the proper total amount of fuel is injected into the engine.

Figure 3:
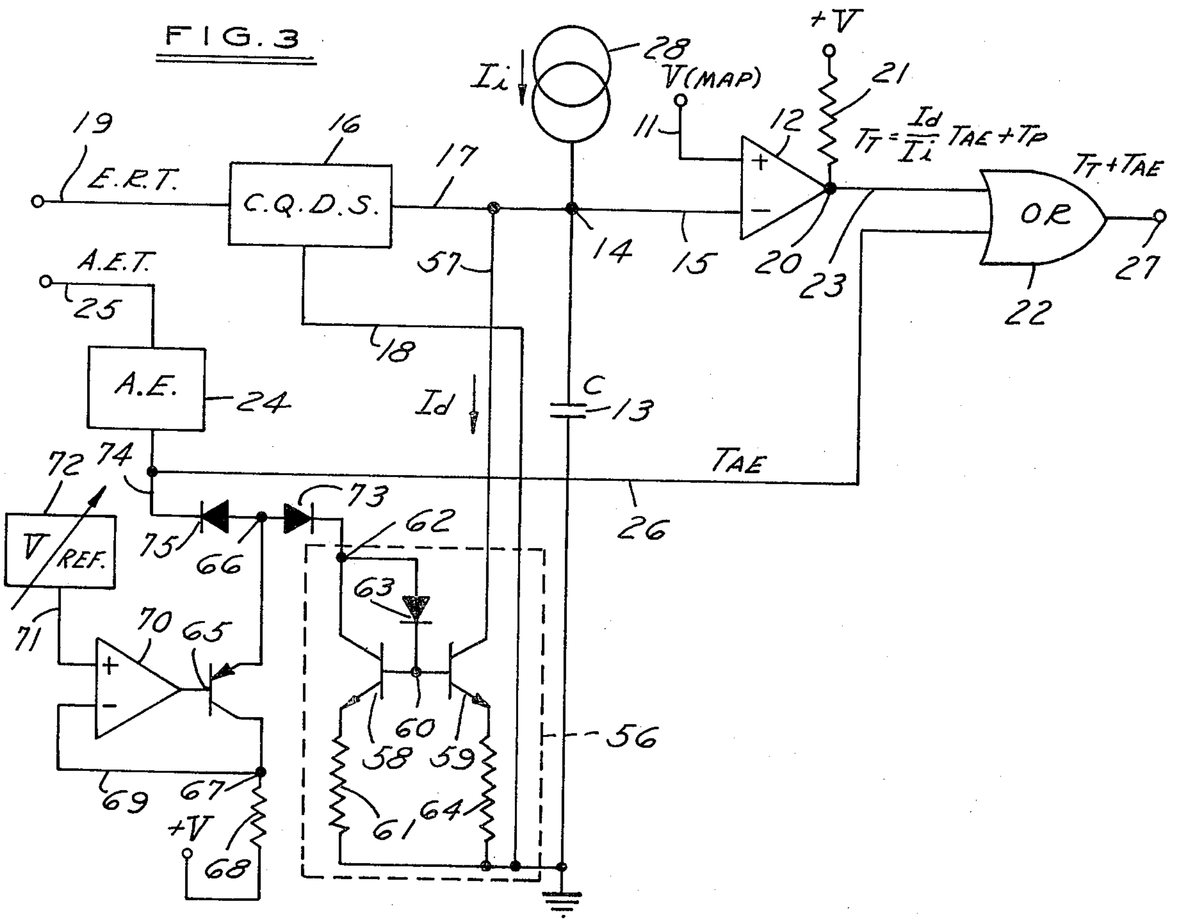
FIG. 3 is an alternate embodiment of the pulse time addition circuit of the present invention.

FIG. 3 represents a schematic illustration of a generalized alternate embodiment of the present invention wherein similar elements bear corresponding reference numerals. A current mirror circuit 56 is connected via lead 57 to node 14. The current mirror circuit 56 includes a first or primary leg and a second or reflective leg. The current mirror circuit includes first and second NPN transistors 58 and 59 having their bases commonly coupled together at node 60. The emitter of the first transistor 58 is connected through a resistor 61 to ground and the collector is connected directly to a primary leg node 62. Node 62 is connected to the anode of a diode 63 whose cathode is connected directly to node 60 at the commonly coupled bases of the transistors 58, 59. The emitter of transistor 59 is connected through a resistor 64 to ground and its collector is connected directly to lead 57 which comprises the second or reflective branch of the current mirror 56.

A PNP transistor 65 has its collector connected directly to a control node 66 and its emitter connected to an emitter node 67. Node 67 is connected through a resistor 68 to a source of potential +V and through a lead 69 to the inverting input of an operational amplifier 70. The output of the amplifier 70 is connected directly to the base electrode of transistor 65 while the non-inverting input is connected via lead 71 to a circuit for selectively varying a reference voltage potential as represented by the block 72. Depending upon the selected value of the reference signal presented via lead 71 to the non-inverting input of the amplifier 70, the transistor 65 will selectively control the amount of current flowing through resistor 68 and transistor 65 to the node 66.

Node 66 is connected to the anode of a diode 73 whose cathode is connected to node 62 to establish a current path from the +V source of pontential through resistor 68, transistor 65, node 66, diode 73 and node 62 to the first or primary leg of the current mirror 56. With the current in the primary leg of the current mirror 56 being controlled by the setting on the voltage selection circuit 72, the current $I_d$ flowing in the reflected branch 57 of the current mirror 56 will also be controlled.

The output of the acceleration enrichment pulse generating circuit 24 is connected via lead 26 to the second input of OR gate 22 and is also connected via lead 74 to the cathode of a diode 75 whose anode is connected directly to node 66. In operation, the circuit of FIG. 3 will function as previously described whenever the acceleration enrichment pulse $T_{AE}$ occurs outside of the time period of the primary pulse $T_p$.

However, when the acceleration enrichment pulse $T_{AE}$ occurs during the time period of the primary pulse $T_p$, the following occurs. So long as the $T_{AE}$ pulse is low or off, the control current flowing through transistor 65 is diverted from node 66 through diode 75 so as to cause no current $I_d$ to flow in the reflective branch 57 of the current mirror 56. Therefore, any primary pulse $T_p$ to be generated during this period of time will be uneffected since the current $I_i$ will all be available to charge the capacitor 13.

If, however, the $T_{AE}$ pulse goes high or comes on, the diode 75 cannot conduct so the current passing through transistor 65 which is controlled by the setting on the reference selector 72 will flow through the primary branch of the current mirror 56 via diode 73. This current will be reflected by a corresponding current $I_d$ flowing in the reflective branch 57 of the current mirror 56. The current $I_d$ is created by diverting current $I_i$ to prevent it from charging capacitor 13 altogether, or it will slow the rate at which the capacitor 13 is charged by the current $I_i$, or in the extreme case, it may be possible for the current $I_d$ to actually begin to discharge the capacitor 13. In any case, the time period or duration of the pulse $T_T$ outputted from the comparator 12 will be varied in accordance with the selection of reference voltage at the circuit 72.

Mathematically, it can be seen that since the primary fuel control pulse $T_p$ is initiated at the time of an engine rotation trigger and is terminated when the voltage on the capacitor 13 reaches the value of V(map), then $T_p$ is equal given by $$T_p = \frac{C \cdot V(\text{map})}{I_i} \tag{1}$$

The controlled or reflected current $I_d$ is generated, is turned off when $T_{AE}$ is in the low stage and is turned on when $T_{AE}$ is in the high stage. The total pulse width of the pulse outputted by the comparator 12 is therefore given by the equation $$\int_0^{T_T} i\,dt = C \cdot V(\text{map}) \tag{2}$$

which integrates to give $I_i T_T - I_d T_{AE} = C \cdot V(\text{map})$ (3)

and solving for $T_T$ we get $$T_T = \frac{C \cdot V(\text{map})}{I_i} + \frac{I_d}{I_i} T_{AE} = T_p + \frac{I_d}{I_i} T_{AE} \tag{4}$$

This equation indicates that the output of the comparator 12 of FIG. 3 provides a pulse $T_T$ having a time period equal to that of the original primary pulse $T_p$ plus some ratio of $I_d/I_i$ times the duration of the acceleration enrichment pulse $T_{AE}$. This is so since the control current $I_d$ can divert none, the or all of the current available to charge the capacitor 13 or even discharge the capacitor 13, if desired.

It will be seen that the circuit of FIG. 2 is a specific case of the circuit of FIG. 3 wherein $I_d$ is required to be equal to $I_i$. Otherwise stated, the net current in the capacitor 13 when $T_{AE}$ is in the high state is required to be equal to zero. Therefore, the circuit of FIG. 2 turns off the charging current $I_i$ when $T_{AE}$ is in the high state. By solving the equation (2) we get $$I_i(T_T - T_{AE}) = C \cdot V(\text{map}) \tag{5}$$

and solving for $T_T$ we get $$T_T = \frac{C \cdot V(\text{map})}{I_i} + T_{AE} = T_p + T_{AE} \tag{6}$$

Therefore, the circuits of FIGS. 2 and 3 insure that sufficient pulse time is added to the pulse time of the primary pulse $T_p$ whenever the acceleration enrichment pulse $T_{AE}$ occurs during the time period of the primary pulse $T_p$, thereby insuring that the proper total amount of fuel is always injected into the engine regardless of the time of occurrence of the various control pulses.

With this detailed description of the specific apparatus used to illustrate the prime embodiment of the present invention and the operation thereof, it will be obvious to those skilled in the art that various modifications can be made in the present invention and in the various circuit elements and components thereof without departing from the spirit and scope of the invention which is limited only by the appended claims.

I claim:

1. An electronic fuel injection system for an internal combustion engine having a fuel injection means energized by electrical pulses for periods of time determined by the duration of said pulses; said fuel injection system comprising:

means for generating primary pulses $T_p$ of a duration dependent on the operating parameters of the engine, said $T_p$ pulses generated synchronously with a trigger signal dependent upon the speed of revolution of the engine;

means for generating acceleration enrichment pulses $T_{AE}$ of a duration and frequency dependent upon an acceleration enrichment trigger signal which is responsive to a desired acceleration, wherein said $T_{AE}$ pulses are asynchronous with said $T_p$ pulses; and a pulse time addition means for combining said $T_p$ pulses and said $T_{AE}$ pulses in order to generate a total pulse signal to said injection means that has a duration equivalent to the sum of said $T_p$ pulses and said $T_{AE}$ pulses, wherein said pulse time addition means interrupts the generation of said primary pulses $T_p$ for a time duration equivalent to said $T_{AE}$ pulses and then permits the completion of the generation of said primary pulses $T_p$, said pulse time addition means thereby preventing the loss of fuel to the engine when said $T_p$ and $T_{AE}$ pulses overlap.

2. An electronic fuel injection system for an internal combustion engine as defined in claim 1 wherein said pulse time addition means includes:

means for generating said total pulse signal during the time either a Tp or $T_{AE}$ pulse is present alone and for extending said Tp pulse when it occurs simultaneously with a $T_{AE}$ pulse wherein said Tp pulse extension is equivalent to the time of pulse overlap.

3. A pulse time addition circuit comprising:

a charging capacitor;

means for periodically discharging said capacitor in response to a trigger signal;

means for normally supplying current to said capacitor and for charging the capacitor at a rate determined by said current;

means for generating a first pulse $T_1$ asynchronous to said trigger signal having a pulse duration $t_1$;

means responsive to the charging of said capacitor for generating a second pulse $T_2$ initiated after said discharge, said second pulse $T_2$ normally having a pulse duration $t_2$ dependent upon said charging rate of the capacitor whenever said first pulse $T_1$ does not exist simultaneously therewith but having an increased pulse duration $t_1+t_2$ whenever said first pulse $T_1$ exists simultaneously therewith, said second pulse generating means including means responsive to the existence of said first pulse $T_1$ for interrupting the supply of current to said capacitor to delay further charging of said capacitor for the time period $t_1$ thereby increasing the time period of said second pulse $T_2$ if it is being generated simultaneously with the first pulse $T_1$; and means coupled to the outputs of said first and second pulse generating means for outputting a pulse combination $T_1+T_2$ having a total pulse duration $t_1+t_2$ regardless of whether said pulses exist simultaneously.

4. The pulse time addition circuit of claim 3 wherein said charging capacitor has one plate coupled to said means for supplying current and its opposite plate coupled to ground and wherein said means for generating said second pulse includes an operational amplifier having the non-inverting input thereof coupled to a variable reference potential, the inverting input thereof coupled to said one plate of said charging capacitor for sensing the charge stored thereon, and its output coupled to a source of potential such that said output goes "high" after said capacitor has been discharged and goes "low" whenever the voltage at said first plate of said capacitor has attained a predetermined relationship with respect to the value of said predetermined reference potential.

5. The pulse time addition circuit of claim 3 wherein said charging capacitor has one plate coupled to said means for normally supplying current and its other plate coupled to ground and wherein said means for periodically discharging said capacitor includes means for periodically generating trigger pulses and a switching means responsive to the generation of a trigger pulse for momentarily completing a current path between said one plate of said charging capacitor and ground to quickly discharge said capacitor and enable it to again begin charging from said normally supplied current.

6. The pulse time addition circuit of claim 3 wherein said means coupled to the outputs of said first and second pulse generating means includes a logical OR gate having one input connected to the output of said means for generating said first pulse and the other input coupled to the output of said means for generating said second pulse, said logical OR gate outputting a pulse combination $T_1+T_2$ having a pulse time duration $t_1+t_2$ regardless of said pulses exist simultaneously.

7. A pulse time addition circuit comprising:

a charging capacitor;

means for periodically discharging said capacitor in response to a trigger signal;

means for normally supplying current to said capacitor and for charging the capacitor at a rate determined by said current;

means for generating a first pulse $T_1$ asynchronous to said trigger signal having a pulse duration $t_1$;

means responsive to the charging of said capacitor for generating a second pulse $T_2$ initiated after said discharge, said second pulse $T_2$ normally having a pulse duration $t_2$ dependent upon said charging rate of the capacitor whenever said first pulse $T_1$ does not exist simultaneously therewith but having an increased pulse duration $t_1+t_2$ whenever said first pulse $T_1$ exists simultaneously therewith, said second pulse generating means including means responsive to the existence of said first pulse $T_1$ for interrupting the supply of current to said capacitor to delay further charging of said capacitor for the time period $t_1$ thereby increasing the time period of said second pulse $T_2$ if it is being generated simultaneously with the first pulse $T_1$;

means coupled to the outputs of said first and second pulse generating means for outputting a pulse combination $T_1+T_2$ having a total pulse duration $t_1+t_2$ regardless of whether said pulses exist simultaneously; and wherein said means for normally supplying current to said capacitor includes a current mirror circuit having first and second legs electrically connected between a current supply and a current return, said charging capacitor being serially coupled in said second current mirror leg, transistor means having its collector and emitter electrodes connected in series in said first current mirror leg and further including an operational amplifier having its non-inverting input coupled to a predetermined potential for selectively determining the required charging current, its output connected to the base of said transistor means for controlling the flow of current in said first current mirror leg, and the emitter electrode of said transistor means being coupled back to the inverting input of said operational amplifier for establishing a transconductance device such that said operational amplifier determines the current flowing in said first leg of said current mirror circuit and this current is reflected in the second leg of said current mirror circuit for determining the current supplied to said charging capacitor.

8. The pulse time addition circuit of claim 7 wherein said current mirror circuit includes a first and second PNP transistor, the first PNP transistor having its emitter resistively coupled to a source of potential, its base coupled to the base of said second PNP transistor and its collector connected to the first leg of said current mirror circuit, a diode having its anode connected to the commonly coupled bases of said first and second PNP transistors and its cathode connected to the collector of said first PNP transistor, and said second PNP transistor having its emitter resistively coupled to said source of potential and its collector coupled to said second leg of said current mirror circuit at said one plate of said charging capacitor, the current flowing in the first leg of said current mirror circuit being controlled by the value of predetermined potential at the non-inverting input of said operational amplifier and the value of this current being reflected from the first PNP transistor of the current mirror circuit to the second PNP transistor of the current mirror circuit such that approximately the same charging current is supplied in the second current mirror leg to said charging capacitor.

9. The pulse time addition circuit of claim 8 wherein said means for interrupting the supply of current to said capacitor includes a switching transistor having its emitter coupled to ground and its collector resistively coupled to the emitter of the second PNP transistor of said current mirror circuit, the base of said switching transistor being resistively coupled to ground and resistively coupled to the output of said means for generating said first pulses $T_1$ such that the existence of one of said first pulses $T_1$ turns said switching transistor on thereby preventing the required charging current from flowing in the second leg of said current mirror circuit for the time period of said first pulse $T_1$.

10. A pulse time addition circuit comprising:

means for supplying charging current;

a charging capacitor having one plate coupled to said supply of charging current and its opposite plate coupled to ground;

means coupled between said one plate of said charging capacitor and ground for periodically discharging said capacitor in response to a trigger signal;

means for generating a first time pulse $T_1$ asynchronous to said trigger signal having a first pulse duration $t_1$;

means responsive to the charging of said capacitor for generating a second pulse $T_2$, said second pulse $T_2$ normally having a pulse duration $t_2$ whenever said first pulse $T_1$ does not exist simultaneously therewith but having a time duration $t+t_2$ whenever said first pulse $T_1$ exists simultaneously therewith;

means responsive to the existence of said first pulse $T_1$ for varying the supply of current to said charging capacitor to vary the charging thereof by said time period t which varies the overall time period of the second pulse $T_2$ if it is being generated simultaneously with $T_1$; and means coupled to the outputs of said first and second pulse generating means for outputting a pulse combination $T_1+T_2$ having a total pulse duration $t_1+t_2$ or $t+t_2$ depending upon whether or not said pulses exist simultaneously.

11. In an electronic fuel injection system wherein fuel injectors are turned on by electrical pulses for periods determined by the pulse duration which varies with information received from various sensors such as those which produce a voltage which varies with the intake manifold absolute pressure, the fuel injection system generating at least a primary injection pulse $T_p$ which is triggered for each revolution of the engine and auxiliary asynchronous enrichment pulses $T_{AE}$ which are initiated by acceleration conditions, the improvement comprising a pulse time addition circuit to insure that the proper amount of fuel is supplied for all $T_P$ and $T_{AE}$ pulses by insuring that the time period of the $T_{AE}$ pulse is always added to the time period $T_P$ pulse regardless of whether they occur simultaneously, said pulse time addition circuit comprising:

a charging capacitor having a first plate and a grounded plate;

means coupled between said first plate and ground for rapidly discharging said capacitor synchronously with a trigger signal once for each revolution of the engine;

a current source coupled to said first plate for normally supplying charging current to said charging capacitor;

switching means responsive to the presence of a $T_{AE}$ pulse for interrupting the supply of said charging current to said charging capacitor delaying its charging for the duration of said $T_{AE}$ pulse;

operational amplifier means having its non-inverting input coupled to a reference voltage which varies with the intake manifold absolute pressure, its inverting input coupled to the first plate of said charging capacitor for sensing the charge stored thereon and its output adapted to generate a pulse $T_t$, where $T_t$ is equal to $T_P$ when $T_{AE}$ occurs other than during the period of said $T_p$ pulse and where $T_t$ is equal to $T_p+T_{AE}$ when $T_{AE}$ occurs during the period of said $T_p$ pulse; and logical OR gating means having one input coupled to the output of said operational amplifier means and the other input connected to said source of $T_{AE}$ pulses for gererating an output $T_t$ "or" $T_{AE}$ to insure that the time period of the acceleration enrichment pulse $T_{AE}$ is added to the time period of the primary pulse $T_p$ whether or not the auxiliary enrichment pulse $T_{AE}$ occurs within or without the time period of the primary pulse $T_p$.

12. In an electronic fuel injection system wherein fuel injectors are turned on by electrical pulses for periods determined by the pulse duration which varies with information received from various sensors such as those which produce a voltage which varies with the intake manifold absolute pressure, the fuel injection system generating at least a primary injection pulse $T_p$ which is triggered for each revolution of the engine and auxiliary asynchronous enrichment pulses $T_{AE}$ which are initiated by acceleration conditions, the improvement comprising a pulse time addition circuit to insure that the proper amount of fuel is supplied for all $T_p$ and $T_{AE}$ pulses by insuring that the time period of the $T_{AE}$ pulse is always added to the time period $T_p$ pulse regardless of whether they occur simultaneously, said pulse addition circuit comprising:

a charging capacitor having a first plate and a grounded plate;

means coupled between said first plate and ground for rapidly discharging said capacitor synchronously with a trigger signal once for each revolution of the engine;

a current source coupled to said first plate for normally supplying charging current to said charging capacitor;

switching means responsive to the presence of a $T_{AE}$ pulse for interrupting the supply of said charging current to said charging capacitor delaying its charging for the duration of the $T_{AE}$ pulse;

operational amplifier means having its non-inverting input coupled to a reference voltage which varies with the intake manifold absolute pressure, its inverting input coupled to the first plate of said charging capacitor for sensing the charge stored thereon and its output adapted to generate a pulse $T_t$, where $T_t$ is equal to $T_p$ when $T_{AE}$ occurs other than during the period of said $T_p$ pulse and where $T_t$ is equal to $T_p+T_{AE}$ when $T_{AE}$ occurs during the period of said $T_p$ pulse;

logical OR gating means having one input coupled to the output of said operational amplifier means and the other input connected to said source of $T_{AE}$ pulses for generating an output $T_t$ "or" $T_{AE}$ to insure that the time period of the acceleration enrichment pulse $T_{AE}$ is added to the time period of the primary pulse $T_p$ whether or not the auxiliary enrichment pulse $T_{AE}$ occurs within or without the time period of the primary pulse $T_p$; and wherein said current source includes a current mirror circuit having a first leg for conducting a controlled current and a second leg connected to the first plate of said charging capacitor for conducting a charging current, a transconductance transistor connected in series with said first leg, an operational amplifier having its non-inverting input connected to a source of reference potential for determining the value of the controlled current flowing in said first leg, its inverting input connected to the emitter of said transistor, and the output being connected to the base of said transistor for controlling the current flowing therethrough, the value of reference signal at the non-inverting input of said operational amplifier controlling the conductance of said transistor and therefore the current flowing in the first leg of said current mirror circuit and therefore the mirrored charging current flowing in the second leg of said current mirror circuit for charging said capacitor.

13. The improved electronic fuel injection system of claim 12 wherein said current mirror circuit includes first and second transistors having their bases commonly coupled together, the emitter of said first transistor being coupled through a first resistor to a source of potential and the collector being coupled to the collector of said transconductance transistor and the emitter of said second transistor being coupled through a second resistor to said source of potential and the collector of said second transistor being coupled to the first plate of said charging capacitor such that the value of current flowing in said first transistor of said current mirror circuit which is controlled by the value of the reference potential at the non-inverting input of said operational amplifier is reflected by the current conducted by the second transistor of said current mirror circuit for charging said capacitor.

14. The improved electronic fuel injection system of claim 13 wherein said switching means includes a switching transistor, means for coupling the emitter of said switching transistor to ground, means for coupling the collector of said switching transistor to the emitter of said second transistor of said current mirror circuit, and resistive means for coupling the base of said switching transistor to said source of $T_{AE}$ pulses such that said switching transistor is normally non-conducting so long as no $T_{AE}$ pulse exists but said switching transistor switches to a conducting state as soon as a $T_{AE}$ pulse occurs thereby diverting current from the emitter of the second transistor of said current mirror circuit and preventing said mirrored charging current from being conducted in the second leg of said current mirror circuit thereby preventing the charging of said charging capacitor for the time period of said $T_{AE}$ pulse, upon termination of said $T_{AE}$ pulse said switching transistor switching back to the said non-conducting state thereby allowing said second transistor of said current mirror means to begin conducting and resume the charging of said capacitor.

15. In a pulse time addition circuit for use in an electronic fuel injection system wherein fuel injectors are turned on by electrical pulses whose time period is controlled by various engine conditions, the fuel injection system generating primary pulses $T_p$ which are generated once each engine revolution and auxiliary acceleration enrichment pulses $T_{AE}$ which are generated in response to various throttle conditions, said pulse time addition circuit including a charging capacitor having a first plate and a grounded plate, a capacitor discharge circuit coupled between said first plate and ground and responsive to primary pulse initiation triggers generated once each revolution of the engine for rapidly discharging said capacitor, current generating means for supplying charging current to said capacitor, a source of acceleration enrichment pulses $T_{AE}$, an operational amplifier having its non-inverting input coupled to a reference potential which varies with the intake manifold absolute pressure of the engine, its inverting input coupled to said first plate of said capacitor and its output adapted to supply a pulse $T_t$, where $T_t$ has a time period equal to that of $T_p$ when $T_{AE}$ does not occur during the time period of $T_p$ and where $T_t$ has a time period equal to that of $T_p+T_{AE}$ where $T_{AE}$ does occur during the period of $T_p$; and logical OR gating means having one input coupled to the output of said operational amplifier means and another input coupled to the source of acceleration enrichment pulses $T_{AE}$ so as to output a pulse combination whose time period is equal to that of $T_p$ and $T_{AE}$ regardless of whether $T_{AE}$ occurs within or without the time period of $T_p$ to insure that sufficient fuel is injected into the engine, the improvement residing in said current generating means and comprising a current mirror circuit having a primary leg and a reflected leg, said reflective leg being connected in series to the first plate of said capacitor, transconductive means connected in series with the primary leg of said current mirror circuit for selectively controlling the value of primary current flowing in said primary leg thereby controlling the value of the reflected charging current flowing in the reflective leg of said current mirror circuit for charging said capacitor, and switching means responsive to the presence of an acceleration enrichment pulse $T_{AE}$ for preventing the flow of the reflected current in said reflective leg of said current mirror circuit during the period of the pulse $T_{AE}$ thereby preventing the capacitor from charging during this time and increasing the time period of pulse $T_t$ outputted by said operational amplifier.

16. The pulse time addition circuit of claim 15 wherein said transconductance means includes a transistor having its collector coupled to the primary leg of said current mirror circuit and its emitter resistively coupled to ground and an operational amplifier having its output connected to the base of said transistor for controlling the conductivity thereof, its non-inverting input coupled to a source of reference potential for determining the value of current flowing in said primary leg and means for coupling the inverting input to the emitter of said transistor so that the conductance of said transistor is determined by the selected value of reference signal applied to the non-inverting input of the operational amplifier thereby controlling the value of primary current flowing in the primary leg of said current mirror circuit thereby determining the reflected value of charging current flowing in the reflective leg of said current mirror circuit.

17. The pulse time addition circuit of claim 15 wherein said current mirror circuit includes first and second transistors having commonly coupled base electrodes, the emitter electrode of said first transistor being resistably coupled to a source of potential and the collector electrode being coupled to said transconductance means to form the primary leg of said current mirror circuit, the emitter electrode of said second transistor being resistably coupled to said source of potential and the collector electrode of said second transistor being connected directly to said first plate of said charging capacitor to form the second leg of said current mirror circuit so that the value of the primary current flowing in the primary leg of said current mirror circuit is reflected by a corresponding reflected charging current flowing in the reflective leg of said current mirror circuit for charging said capacitor.

18. The pulse time addition circuit of claim 17 wherein said switching means includes a switching transistor having its collector resistively coupled to the emitter of said second transistor, its emitter coupled to ground, and its base resistively coupled to said source of acceleration enrichment pulses, said switching transistor being responsive to the absence of a $T_{AE}$ pulse for maintaining a normally non-conductive state which does not interfere with the flow of reflected current in the reflective leg of said current mirror for charging said capacitor but being responsive to the presence of the $T_{AE}$ pulse for switching to a conductive state and preventing the reflected charging current from flowing to charge said capacitor for the time duration of said $T_{AE}$ pulse, said switching transistor being adapted to return to said non-conductive state upon termination of said $T_{AE}$ pulse for restoring the flow of reflected charging current to said capacitor.

19. A pulse time addition circuit comprising:

means for supplying charging current;

a charging capacitor having one plate coupled to said supply of charging current and its opposite plate coupled to ground;

means coupled between said one plate of said charging capacitor and ground for periodically discharging said capacitor in response to a trigger signal;

means for generating a first time pulse $T_1$ asynchronous to said trigger signal having a first pulse duration $t_1$;

means responsive to the charging of said capacitor for generating a second pulse $T_2$, said second pulse $T_2$ normally having a pulse duration $t_2$ whenever said first pulse $T_1$ does not exist simultaneously therewith but having a time duration $t+t_2$ whenever said first pulse $T_1$ exists simultaneously therewith;

means responsive to the existence of said first pulse $T_1$ for varying the supply of current to said charging capacitor to vary the charging thereof by said time period t which varies the overall time period of the second pulse $T_2$ if it is being generated simultaneously with $T_1$;

means coupled to the outputs of said first and second pulse generating means for outputting a pulse combination $T_1+T_2$ having a total pulse duration $t_1+t_2$ or $t+t_2$ depending upon whether or not said pulses exist simultaneously;

wherein said means for varying the supply of current to said charging capacitor includes:

a first PNP transistor having its emitter resistively coupled to a source of potential and its collector coupled to a first node;

means for selectively generating a predetermined reference signal whose value determines whether or not said time duration t has a value greater than, equal to or less than the value of $t_1$;

an operational amplifier having its non-inverting input coupled to said means for selectively generating a reference signal, its inverting input directly coupled back to the emitter of said first transistor; and its output coupled to the base of said first transistor for controlling the conduction thereof in accordance with the selected value of said reference signal;

a current mirror circuit having first and second current legs;

a first diode having its anode connected to said first node and its cathode connected to the first leg of said current mirror circuit;

a second diode having its anode connected to said first node and its cathode connected to the output of said means for generating said first pulse $T_1$, the second leg of said current mirror circuit being connected to said one plate of said charging capacitor, a "low" value of said first pulse $T_1$ causing the current generated by said operational amplifier and first PNP transistor combination to be directed away from said current mirror circuit but when said first pulse $T_1$ goes "high", the current dictated by the selected value of reference signal at the non-inverting input of the operational amplifier will be caused to flow in the first leg of the current mirror circuit thereby causing a corresponding current to flow in the second leg of the current mirror circuit thereby diverting current normally supplied by said current supply means to said one plate of said charging capacitor to either slow the rate at which said capacitor is charged, temporarily terminate charging altogether, or being discharging the capacitor depending upon the selected predetermined value of reference signal at the non-inverting input of the operational amplifier such that the output of said means for generating a second pulse has a time duration $t_2$ which is increased or decreased by the time duration of the first pulse $T_1$ times the ratio of the current diverted to the second leg of the current mirror circuit to the current normally supplied to the charging capacitor.

* * * * *